United States Patent [19]

Morimoto et al.

[11] Patent Number: 4,518,465
[45] Date of Patent: May 21, 1985

[54] METHOD OF MANUFACTURING PRINTED WIRING BOARDS

[75] Inventors: Etsuji Morimoto; Keijiro Orito, both of Tokyo, Japan

[73] Assignee: Oki Electric Industry Co., Ltd., Tokyo, Japan

[21] Appl. No.: 648,880

[22] Filed: Sep. 10, 1984

[30] Foreign Application Priority Data

Sep. 17, 1983 [JP] Japan .................. 58-170619

[51] Int. Cl.³ .................. C25D 5/02; C25D 7/04
[52] U.S. Cl. .................. 204/15; 204/24
[58] Field of Search .................. 204/15, 26, 22, 38 B, 204/24; 427/97, 98

[56] References Cited

U.S. PATENT DOCUMENTS

| | | | |
|---|---|---|---|
| 3,532,801 | 10/1970 | Faulkner | 204/15 |
| 3,554,878 | 1/1971 | Rothschild | 204/24 |
| 3,558,441 | 1/1971 | Chadwick | 204/15 |
| 3,798,136 | 3/1974 | Olsen | 204/15 |
| 4,217,182 | 8/1980 | Cross | 204/15 |

Primary Examiner—Thomas Tufariello
Attorney, Agent, or Firm—Frishauf, Holtz, Goodman & Woodward

[57] ABSTRACT

A base substrate of a printed wiring board is coated, by wet plating, with metal films over two major surfaces thereof and the inner walls of through-holes formed therein wherein the metal films formed over the inner walls of the through-holes form via-holes for electrically connecting the metal films formed over the two surfaces with each other. In the wet plating, the base substrate is taken out of the plating bath for a first predetermined period of time, to thereby cause disintegration of bubbles on the surfaces of the base substrate and the inner walls of the through-holes therein. Then, the base substrate is again immersed into the plating bath for a second predetermined period of time to resume the formation of the metal films.

7 Claims, 17 Drawing Figures

METHOD OF MANUFACTURING PRINTED WIRING BOARDS

BACKGROUND OF THE INVENTION

This invention relates to a method of manufacturing printed wiring boards with a multiplicity of small plated through-holes or via holes.

In typical prior art, a printed wiring board is manufactured by the steps of: preparing a substrate comprising an insulating core plate and copper plate films formed on both the surfaces thereof, drilling the substrate to form a plurality of through-holes, electroless-plating with copper to form thin copper films on the walls of the through-holes, subjecting the substrate obtained to a conventional photolithography process to form wiring patterns of copper on the core plate, and electro-plating with copper the substrate obtained to form thick wiring patterns of copper.

Recently, the wiring densities of printed wiring boards have remarkably become high with the reduction in the diameters of via-holes and in the widths of wiring patterns.

However, with via-holes of 0.4 mm or less in diameter, bubbles, produced by the reaction of a plating solution or by the immersion of the substrate into a plating bath, adhere on the surfaces of the substrate and the walls of the through-holes, and disturb the good control in the thickness of a plates film. It is observed that most bubbles on the surface of a base substrate do not easily move their locations during a copper plating process.

In order to overcome such troubles, it has been tried to vibrate the substrate in a plating bath, or to agitate a plating solution. However, it has not succeeded in completely removing bubbles, particularly those on inner walls of via-holes.

In general, it is desirable that a copper film for wiring is at least 30 microns in thickness. However, as shown at portions A and B in FIGS. 1 and 2, it has been difficult to avoid the facts that due to the presence of bubbles the copper film 2 on a substrate 1 is partially thinned to a thickness of only 5 microns or partially cut away on the surface and/or on the inner walls of via-holes 3.

Therefore, when the printed wiring board is subjected to a heat shock test or to a soldering process for mounting electrical parts on the printed wiring board, the thickness variation in the plated film sometimes caused a burnout of the thinned portion of the plated film on the board.

SUMMARY OF THE INVENTION

It is the object of the invention to provide a method of manufacturing printed wiring boards which is capable of positively removing bubbles on the inner walls of small through-holes, thereby achieving a very high yield.

A method of manufacturing a printed circuit board includes a wet plating process which comprises immersing a base substrate having two major surfaces and a multiplicity of through-holes formed therein in a plating bath to coat metal films over the surfaces of the base substrate and the inner walls of the through-holes therein wherein the metal films formed over the inner walls of the through-holes form via-holes for electrically connecting the metal films formed over the surfaces with each other.

The method according to the invention is characterized in that the wet plating process comprises (a) taking the base substrate out of the plating bath for a first predetermined period of time, to thereby cause disintegration of bubbles on the surfaces of the base substrate and the inner walls of the through-holes therein, and (b) then again immersing the base substrate into the plating bath for a second predetermined period of time to resume formation of the metal films on the surfaces of the base substrate and the inner walls of the through-holes therein.

The above and other objects, features and advantages of the invention will be more apparent from the ensuing detailed description taken in conjunction with the accompanying drawings.

DETAILED DESCRIPTION

Figure 1:
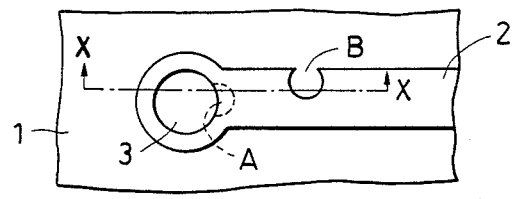
FIG. 1 is a fragmentary schematic plan view of a printed wiring board manufactured by a conventional method.
Figure 2:
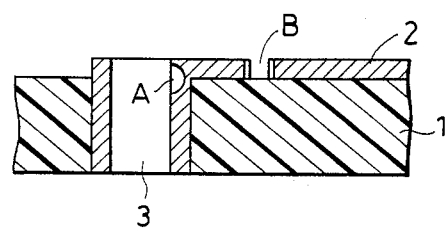
FIG. 2 is a sectional view taken along line X—X in FIG. 1.
Figure 3A:
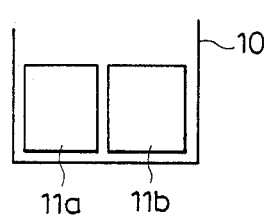
FIG. 3 (a) through FIG. 3 (d) are schematic views of different steps of the method according to the present invention to show the technical concept of same.
Figure 3B:
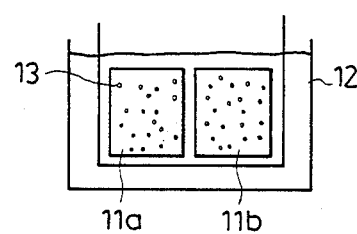
Figure 3C:
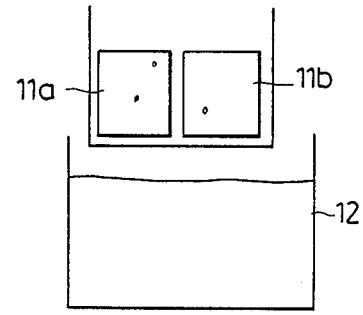
Figure 3D:
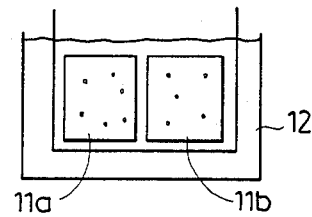

The method according to the present invention will now be described with reference to FIGS. 3 through 5.

Referring first to FIG. 3 (a) through FIG. 3 (d), the method according to the invention is shown to explain the technical concept thereof. First, as shown in FIG. 3 (a), for instance two base substrates 11a and 11b for printed wiring boards with a multiplicity of through-holes therein, not shown, are. These base substrates 11a, 11b are immersed, together with the rack 10, into a wet plating bath 12 which is either an electroless plating bath or an electroplating bath, as shown in FIG. 3 (b), to form metal films by plating on selected surface portions of the base substrates. Then, a multiplicity of bubbles 13 are developed and adhere to the surfaces of the base substrates 11a, 11b due to entrainment of air onto the base substrates, due to generation of a reaction gas during wet plating, or due to agitation of the plating bath for promotion of the plating action. Next, as shown in FIG. 3 (c), the base substrates 11a, 11b with the bubbles 13 stuck thereon are raised above the surface of the plating bath 12 or into the air together with the rack 10, whereby almost all the bubbles 13 become burst and disintegrated. This bursting of the bubbles 13 is due to a pressure difference between the plating bath and the air which the bubbles undergo.

Next, as shown in FIG. 3 (d), the base substrates 11a, 11b are immersed into the plating bath 12 to resume the plating operation of forming the metal films. The above steps shown in FIGS. 3(c) and 3(d) are repeated to obtain plated films having a predetermined thickness. For example, in an electro copper plating process, the plating time is 5 to 20 minutes per cycle to obtain a plated copper film of 2.5 to 10 microns in thickness. Also, in an electroless copper plating process, the plating time is 5 to 10 minutes per cycle to obtain a plated copper film of 0.3 to 0.5 microns in thickness. A time for which the base substrate should stay in air is preferably 10 seconds at maximum to prevent the oxidation of the plated films.

According to an intermittent plating method of the invention, the chances are drastically decreased that bubbles stick on the same portions of surfaces of a base substrate, so that it is possible to uniformly form plated on the surfaces of the substrate. It has been empirically ascertained that the taking-out frequency should be increased to obtain good results if the plating is to form a fine wiring pattern, to form a plated metal film on the inner walls of very small through-holes, or to form a plated metal film at a high rate.

An embodiment of the method according to the invention will now be described with reference to FIG. 4 (a) through FIG. 4 (h). This embodiment is applied to the manufacture of a so-called metal-centered printed wiring board using a base substrate which comprises a metal core plate and an insulating resin film coated over all the surfaces of the core plate. Referring first to FIG. 4 (a), an iron plate 21 with a multiplicity of through-holes 20 formed therein is prepared as the metal core plate. The surfaces of the iron plate 21 and the inner walls of the through-holes 20 therein are coated with an insulating resin film 22 formed e.g. of epoxy resin, by a conventional electrostatic powder coating method or a conventional fluidized bed coating method, to obtain a base substrate 1'. Then, after subjecting the surface of the insulating film 22 to an activation process, the base substrate 1' is immersed in an electroless plating bath having a bath composition of $Cu^{2+}$ 3 g/l and NaOH 10–12 g/l having a pH value of 12.8 to form a thin copper film 25 as a wiring foundation over the surfaces of the base substrate 1', as shown in FIG. 4 (b). After the immersion of the base substrate 1' into the plating bath 23 for seven minutes as shown in FIG. 5, the base substrate 1' is raised above the plating bath 23 or into the air to cause bursting or disintegration of bubbles 24 stucked thereon (FIG. 4 (c)). Then, after staying for ten seconds in the air, the base substrate 1' is again immersed into the plating bath 23 to thickly form the copper film 25 over the base substrate 1'. The electroless plating process is repeatedly carried out at an interval of 7 minutes with an air-staying time of 10 seconds, to form the foundation copper film 25 having a thickness of 1 micron with the total plating time of 20 minutes.

Figure 4A:
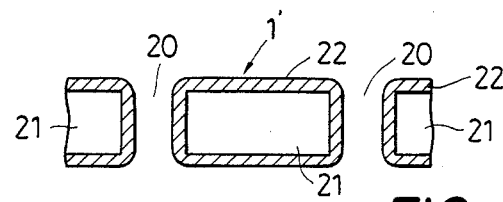
FIG. 4 (a) through FIG. 4 (h) are schematic sectional views of different steps according to an embodiment of the method according to the invention, which is applied to the manufacture of a metal-centered printed wiring board.
Figure 4B:
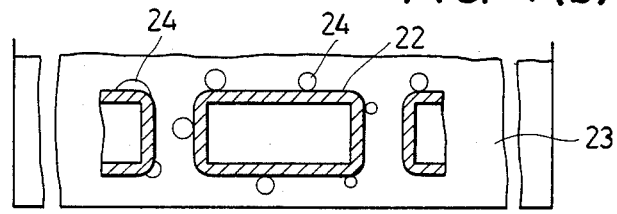
Figure 4C:
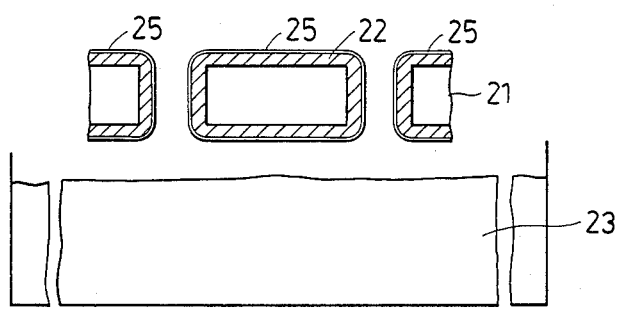
Figure 4D:
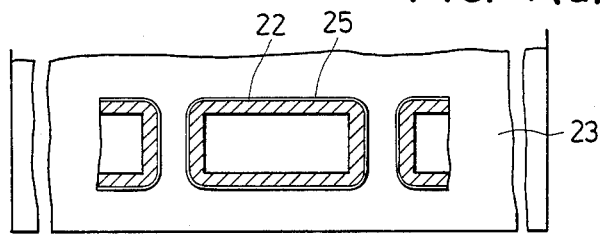
Figure 4E:
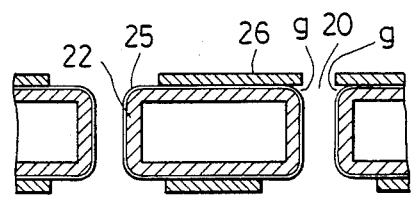
Figure 4:
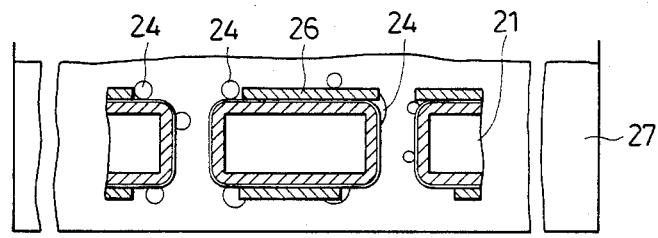
Figure 4G:
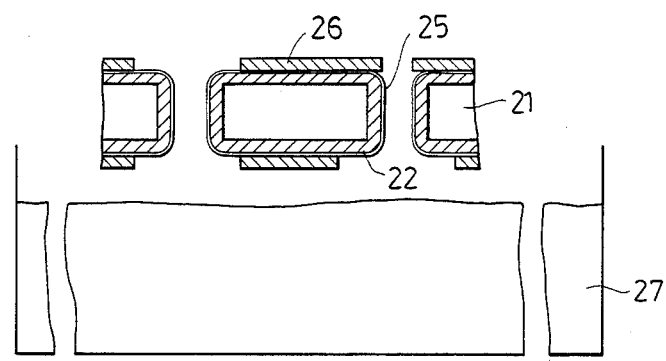
Figure 4H:
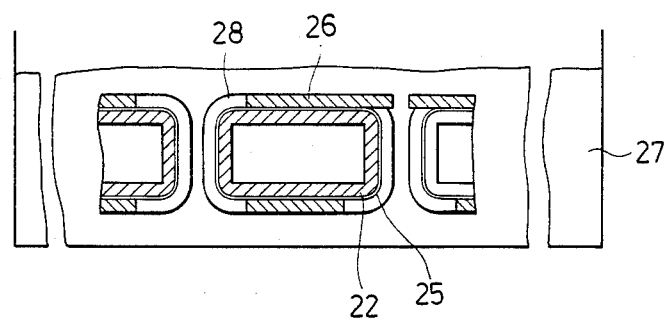
Figure 5:
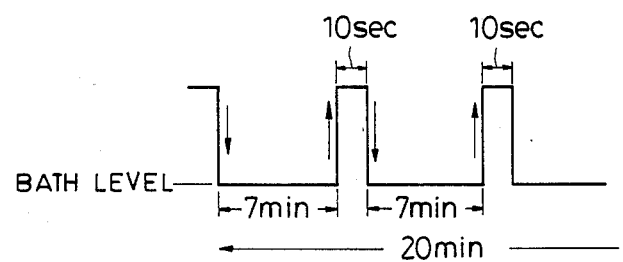
FIG. 5 is a view showing the electroless plating cycle of the embodiment of FIGS. 4 (a)–4 (h) according to the invention.

Next, as shown in FIG. 4 (e), a masking material 26 is laid over surface portions of the base substrate 1' other than selected portions thereof on which wiring patterns are to be formed. It should be noted that on this occasion gaps g are defined between the foundation copper film 25 and marginal edges of the masking materials 26 in the through-holes 20, as noted in FIG. 4 (e).

Figure 6:
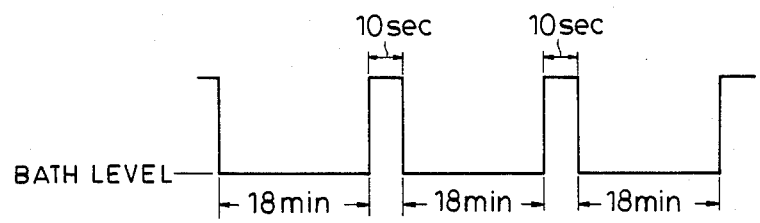
FIG. 6 is a view showing the the electroplating cycle of the embodiment of FIGS. 4 (a)–4 (h) according to the invention.

Then, the base substrate 1' thus obtained by the step shown in FIG. 4 (e) is subjected to electroplating under plating conditions of the deposition rate of 13 microns/hour-$A$/dm$^2$, the plating time of 54 minutes, and the current density of 2–4 $A$/dm$^2$, preferably 3 $A$/dm$^2$. As shown in FIG. 4 (f), the base substrate 1' is immersed in an electroplating bath 27 having a bath composition of $Cu^{2+}$ 18 g/l and $H_2SO_4$ 180 g/l. Upon a lapse of 18 minutes from the time of the first immersion as shown in FIG. 6, the base substrate 1' is raised above the plating bath 27 or into the air as shown in FIG. 4 (g) to cause bursting or disintegration of bubbles 24 stuck thereon. Bubbles 24, which are easily formed in the aforementioned gaps g in particular at the time of immersion shown in FIG. 4 (f), also disappear without fail upon raising of the base substrate 1' into the air. Thereafter, after being held in the air for ten seconds, the base substrate 1' is again immersed into the electroplating bath 27 for resumption of the electroplating operation to further form a plating copper film 28 on the base substrate 1', as shown in FIG. 4 (h).

As shown in FIG. 6, the cycle of taking the base substrate 1' out of and immersing same into the plating bath 27 is repeatedly carried out at an interval of 18 minutes with an air-staying time of 10 seconds to complete the electroplating operation.

After completion of the step of FIG. 4 (h) of forming the plating copper film 28 over the base substrate 1', the base substrate 1' is subjected to removal of the masking material 26 and washing by known methods, into a completed printed wiring board.

Figure 7:
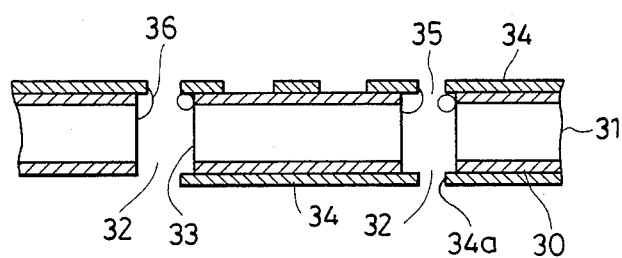
FIG. 7 is a sectional view of a printed wiring board of a landless high density type as another example, in one of the steps of another embodiment of the method according to the invention.

FIG. 7 shows another embodiment of the method according to the invention. This embodiment is applied to a method of manufacturing a high density printed wiring board of landless type which has been proposed by the assignee of the present application in Japanese Provisional Patent Publications (Kokai) Nos. 58-2100, 58-2091, and 58-2092. Most of the steps of this embodiment are substantially identical with corresponding ones of the preceding embodiment shown in FIGS. 4 (a)–4 (h), and therefore only steps of the present embodiment which provide unique results thereof will now be described with reference to FIG. 7.

In FIG. 7, a copper-clad laminated plate 31 is formed of an insulating glass-epoxy resin material and copper foils 30 applied over two major surfaces thereof, and is formed therein with a multiplicity of through-holes 32. The laminated plate 31 is subjected to electroless plating under substantially the same conditions as in the preceding embodiment so that copper films 33 are formed over the inner walls of the through-holes 32. During this electroless plating, the laminated plate 31 may be subjected to removal of bubbles, for instance, in the same manner as in the preceding embodiment, if required. After the formation of the copper films 33 by electroless plating, wiring patterns are formed by electroplating over selected surface portions of the copper foils 30 as well as over the inner walls of the through-holes 32, which may be effected in substantially the same conditions as in the preceding embodiment. Before this formation of wiring patterns, masking materials 34 are applied over the surfaces of the laminated plate 31 to shield surface portions of the copper foils 30 other than the selected surface portions thereof. The masking materials 34 are formed with openings 35 much smaller in diameter than the respective through-holes 32 and applied over the laminated plate 31 so that they fully cover surface portions of the copper foils 30 on the perimeters of the through-holes 32 so as not to form lands on the same surface portions, that is, so as to allow some mask aligning tolerances. As a result, the masking materials 34 have overhangs 34a lying in opposite ends of the respective through-holes 32. However, in spaces between the overhangs 34a and the opposite ends of the through-holes 32 can stay hydrogen gas generated by the electroplating reaction in the form of bubbles. The presence of such bubbles of hydrogen gas greatly impedes sufficient formation of metal films by electroplating on the inner walls of the through-holes 32. To overcome this disadvantage, according to the invention, after being immersed in the electroplating bath, the laminated plate 31 with the masking materials 34 applied thereon is raised above the plating bath or into the air to cause bursting or disintegration of the bubbles 36 stuck thereto and again immersed into the plating bath, under substantially the same conditions as described with respect to the preceding embodiment. The cylce of taking the laminated plate out of and immersing same into the plating bath may be repeatedly executed according to necessity. In this manner, homogeneous and uniform metal films can be formed over the laminated plate 31 by electroplating, particularly over the inner walls of the through-holes 32.

What is claimed is:

1. A method of manufacturing a printed wiring board including a wet plating process which comprises immersing a base substrate with a multiplicity of through-holes having two major surfaces in a plating bath to coat metal films over the two surfaces of said base substrate and the inner walls of said through-holes therein wherein said metal films formed over the inner walls of said through-holes form via-holes for electrically connecting said metal films formed over the two surfaces of said base substrate with each other, said wet plating process comprising the steps of: (a) taking said base substrate out of said plating bath for a first predetermined period of time, to thereby cause disintegration of bubbles on the surfaces of said base substrate and the inner walls of said through-holes therein; and (b) then again immersing said base substrate into said plating bath for a second predetermined period of time to resume formation of said metal films on the surfaces of said base substrate and the inner walls of said through-holes therein.

2. A method as claimed in claim 1, wherein said wet plating process is electroplating.

3. A method as claimed in claim 1, wherein said wet plating process is electroless plating.

4. A method as claimed in claim 1, wherein said step (a) and said step (b) are repeatedly executed a plurality of times.

5. A method as claimed in claim 1, wherein said atmosphere is the air.

6. A method as claimed in claim 1, wherein said base substrate comprises a metal plate, and an insulating film coated over two major surfaces of said metal plate and over the inner walls of said through-holes formed in said plate.

7. A method as claimed in claim 1, wherein said base substrate comprises an insulating plate, and copper foils coated over two major surfaces of said insulating plate.

* * * * *